US007352607B2

(12) United States Patent
Furukawa et al.

(10) Patent No.: US 7,352,607 B2
(45) Date of Patent: Apr. 1, 2008

(54) NON-VOLATILE SWITCHING AND MEMORY DEVICES USING VERTICAL NANOTUBES

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 11/161,183

(22) Filed: Jul. 26, 2005

(65) Prior Publication Data

US 2007/0025138 A1    Feb. 1, 2007

(51) Int. Cl.
*G11C 11/00*    (2006.01)
(52) U.S. Cl. .................. 365/151; 977/943; 977/939; 977/742; 257/E51.04
(58) Field of Classification Search ............. 365/244, 365/129, 151, 166, 164; 977/943, 949, 939, 977/977, 742; 257/415, E51.04
See application file for complete search history.

(56) References Cited

U.S. PATENT DOCUMENTS

| 6,433,543 | B1* | 8/2002 | Shahinpoor et al. ...... 324/244.1 |
| 6,445,006 | B1* | 9/2002 | Brandes et al. ............... 257/76 |
| 6,515,325 | B1 | 2/2003 | Farnworth et al. |
| 6,566,704 | B2* | 5/2003 | Choi et al. .................. 257/314 |
| 6,625,047 | B2* | 9/2003 | Coleman, Jr. ................ 365/51 |
| 2003/0090190 | A1* | 5/2003 | Takai et al. ................. 313/311 |
| 2003/0168683 | A1 | 9/2003 | Farnworth et al. |
| 2004/0020681 | A1* | 2/2004 | Hjortstam et al. ..... 174/102 SC |
| 2004/0095837 | A1 | 5/2004 | Choi et al. |
| 2004/0149979 | A1 | 8/2004 | Cheong et al. |
| 2004/0159833 | A1 | 8/2004 | Rueckes et al. |
| 2004/0175856 | A1* | 9/2004 | Jaiprakash et al. ........... 438/52 |
| 2004/0238907 | A1* | 12/2004 | Pinkerton et al. ........... 257/419 |
| 2005/0037547 | A1* | 2/2005 | Bertin et al. ................ 438/142 |

FOREIGN PATENT DOCUMENTS

| EP | 1420414 A1 | 5/2004 |
| EP | 1435660 A2 | 7/2004 |

OTHER PUBLICATIONS

S. Hofmann, B. Kleinsorge, C. Ducati, A. C. Ferrari and J. Robertson, Low-temperature plasma enhanced chemical vapour deposition of carbon nanotubes, Diamond and Related Materials, vol. 13, Issues 4-8, 14th European Conference on Diamond, Diamond-Like Materials, Carbon Nanotubes, Nitrides and Silicon Carbide, Apr.-Aug. 2004, pp. 1171-1176.*

* cited by examiner

*Primary Examiner*—Anh Phung
*Assistant Examiner*—Douglas King
(74) *Attorney, Agent, or Firm*—Schmeiser, Olsen & Watts; William D. Sabo

(57) ABSTRACT

Non-volatile and radiation-hard switching and memory devices using vertical nano-tubes and reversibly held in state by van der Waals' forces and methods of fabricating the devices. Methods of sensing the state of the devices include measuring capacitance, and tunneling and field emission currents.

8 Claims, 16 Drawing Sheets

NON-VOLATILE SWITCHING AND MEMORY DEVICES USING VERTICAL NANOTUBES

FIELD OF THE INVENTION

The present invention relates to the field of non-volatile memory devices; more specifically, it relates to non-volatile switching and memory devices using vertical nanotubes and the method of fabricating non-volatile switching and memory devices using vertical nanotubes.

BACKGROUND OF THE INVENTION

There is a continuing need to improve the performance, decrease the power consumption and decrease the dimensions of solid-state electronic devices, particularly those used as cells for memory devices and as switching devices. Further, as semiconductor device sizes decrease, various sources of radiation have been shown to cause changes in state of semiconductor-based memory and switching devices.

Therefore, there is a need for memory and switching devices that are both non-volatile and radiation hard.

SUMMARY OF THE INVENTION

A first aspect of the present invention is a structure, comprising: an insulating layer on a top surface of a substrate; an electrically conductive bitline formed in the insulating layer or on a top surface of the insulating layer, a top surface of the bitline parallel to the top surface of the substrate; a first electrically conductive wordline having a bottom surface, a top surface and a first sidewall; a second electrically conductive wordline having a bottom surface, a top surface and a second sidewall, the top and bottom surfaces of the first and second wordlines parallel to the top surface of the bitline, the first and second sidewalls about perpendicular to the top surface of the bitline, the first and second wordlines spaced apart, the first and second sidewalls facing each other; a dielectric layer between the bottom surfaces of the first and second wordlines and the top surface of the bitline; a dielectric first spacer on the first sidewall and a dielectric second spacer on the second sidewall; the first and second spacers spaced apart, the first and second spacers facing each other, and the top surface of the bitline exposed between the first and second spacers; and at least one electrically conductive nanotube having a first end and an opposite second end, the first end permanently attached to the bitline, the at least one nanotube extending away from the top surface of bitline.

A second aspect of the present invention is the first aspect of the present invention wherein the at least one nanotube is flexible and has a length between the first and second ends such that a portion of the one or more nanotubes proximate to the second end may reversibly contact either the first or the second spacers.

A third aspect of the present invention is the first aspect of the present invention wherein the at least one nanotube is reversibly held in contact with the first or second spacers by van der Waals' forces.

A fourth aspect of the present invention is the first aspect of the present invention wherein the at least one nanotube is a carbon nanotube.

A fifth aspect of the present invention is the first aspect of the present invention wherein the at least one nanotube is a single-wall carbon nanotube.

A sixth aspect of the present invention is the first aspect of the present invention further including: means for voltage biasing the first wordline and the bitline opposite to the second wordline and for voltage biasing the second wordline and the bitline opposite to the first wordline.

A seventh aspect of the present invention is the first aspect of the present invention further including: means for detecting a spike of current on the first or second wordline or on the bitline or means for sensing a change in capacitance between the first wordline and the bitline or between the second wordline and the bitline.

An eighth aspect of the present invention is the first aspect of the present invention further including a third spacer on top of the first spacer, a total thickness of the first and second spacers measured perpendicular to the first sidewall greater than a thickness of the second spacer measured perpendicular to the second sidewall.

A ninth aspect of the present invention is the first aspect of the present invention further including: means for sensing a tunneling current through the second spacer, the current flow between the second wordline and the bitline, the current flowing through the one or more nanotubes.

A tenth aspect of the present invention is the first aspect of the present invention further including: a first dielectric cap having a bottom surface, a top surface and a third sidewall, the bottom surface of the first dielectric cap in direct physical contact and coextensive with the top surface of the first wordline; a second dielectric cap having a bottom surface, a top surface and a fourth sidewall, the bottom surface of the second dielectric cap in direct physical contact and coextensive with the top surface of the second wordline, the third and fourth sidewalls facing each other, the first spacer extending over and in direct physical contact with the third sidewall and the second spacer extending over and in direct physical contact with the fourth sidewall; and an electrically conductive third spacer on the first spacer and an electrically conductive fourth spacer on the second spacer, the third and fourth spacers spaced apart, the third and fourth spacers facing each other, a bottom surface of the third spacer facing and overhanging the top surface of the bitline exposed between the first and second spacers, and a bottom surface of the fourth spacer facing and overhanging the top surface of the bitline exposed between the first and second spacers.

An eleventh aspect of the present invention is the tenth aspect of the present invention wherein: when an upper portion of the at least one nanotube proximate to the second end of the at least one nanotube is in contact with the first spacer, the second end of the at least one nanotube is positioned under but not touching a bottom surface of third spacer; and when the upper portion of the at least one nanotube proximate to the second end of the at least one nanotube is in contact with the second spacer, the second end of the at least one nanotube is positioned under but not touching the bottom surface of fourth spacer.

A twelfth aspect of the present invention is the eleventh aspect of the present invention further including: means for voltage biasing the first wordline and the third spacer opposite to the second wordline and the bitline and for voltage biasing the second wordline and the fourth spacer opposite to the first wordline.

A thirteenth aspect of the present invention is the eleventh aspect of the present further including: means for sensing a field emission current across a first gap between the second end of the at least one nanotube and the bottom surface of the third spacer when the upper portion of the at least one nanotube proximate to the second end of the at least one nanotube is in contact with the first spacer; and means for sensing a field emission current across a second gap between the second end of the at least one nanotube and the bottom surface of the fourth spacer when the upper portion of the at least one nanotube proximate to the second end of the at least one nanotube is in contact with the second spacer.

A fourteenth aspect of the present invention is the first aspect of the present invention wherein the bitline comprises a catalytic material for the formation of carbon nanotubes.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Nanotubes are more correctly called fullerenes, which are closed-cage molecules comprised of atoms arranged in hexagons and pentagons. There are two types of fullerenes, namely closed spheroid cage fullerenes also called "bucky balls", and fullerene tubes. Fullerene tubes come in two types, single-wall fullerenes tubes, which are hollow tube-like structures or and multi-wall fullerene tubes. Multi-wall fullerenes resemble sets of concentric cylinders. Single-wall fullerenes are hereinafter called single-wall nanotubes (SWNT) and multi-wall fullerenes are hereafter called multi-wall nanotubes (MWNT).

While the present invention is described using electrically conductive single-wall and multiple-wall carbon nanotubes comprised of $sp^2$-hybridized carbon, electrically conductive or semi-conductive single-wall and multiple wall nanotubes comprised of other electrically conductive or semi-conductive materials may be substituted for electrically conductive or semi-conductive single or multi-wall carbon nanotubes. For the purposes of the present invention, the term carbon nanotube (CNT) denotes either a carbon SWNT or a carbon MWNT unless otherwise specified.

CNTs used in the embodiments of the present invention are grown on electrically conductive bitlines formed on or embedded in an insulating layer by exposing bitlines to a vapor mixture of a CNT precursor and optionally a CNT catalyst at an elevated temperature. In one example, the CNT precursor is hydrocarbon or hydrocarbon isomer mixture and the bitline comprises iron (Fe), cobalt (Co), nickel (Ni) or other materials known in the art. In one example, formation of CNTs is performed at elevated temperatures between about 400° C. to about 900° C.

When non-carbon SWNTs and MWNTs are substituted for CNTs, besides changes to reactants used to form the non-carbon SWNTs and MWNTs, appropriate changes to the composition of the bitline may be required, however, the material of the bitline remains an electrically conductive material.

Figure 1A:
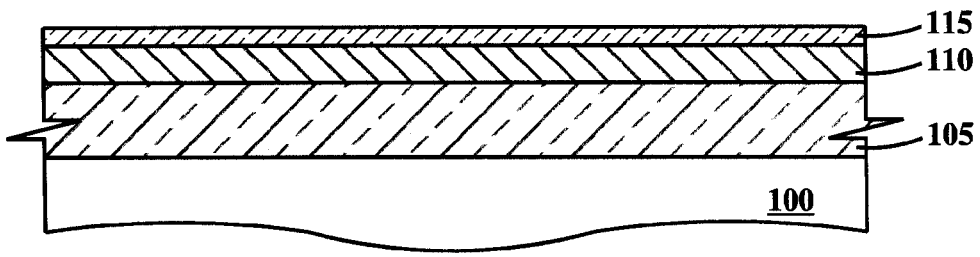
FIGS. 1A through 1G are cross-sectional views illustrating fabrication of a device according to a first embodiment of the present invention.

FIGS. 1A through 1G are cross-sectional views illustrating fabrication of a device according to a first embodiment of the present invention. In FIG. 1A, formed on a top surface of a substrate 100 is a first insulating layer 105. The top surface of substrate 100 defines a horizontal plane and a line perpendicular to the top surface of substrate 100 defines a vertical direction. Formed on a top surface of first insulating layer 105 is a bitline 110. Alternatively, bitline 110 may be damascened into first insulating layer 105, top surfaces of the first insulating layer 105 and bitline 110 being coplanar (see FIG. 2). Formed on a top surface of bitline 110 (and exposed top surface of first insulating layer 105) is a first dielectric layer 115.

In one example, first insulating layer 105 comprises $SiO_2$. In one example, bitline 110 comprises Fe, Co, Ni, other conductive CNT-catalytic material, or combinations thereof. In one example, bitline 110 comprises a layer of Fe, Co, Ni, or other CNT catalytic material and combinations thereof. In one example, bitline 110 comprises a layer Fe, Co, Ni, or other CNT catalytic material over a layer or layers of tungsten (W), titanium (Ti), tantalum (Ta), titanium nitride (TiN), tantalum nitride (TaN), copper (Cu), aluminum (Al) or combinations thereof. In one example, first dielectric layer 115 comprises silicon nitride ($Si_3N_4$).

Figure 1B:
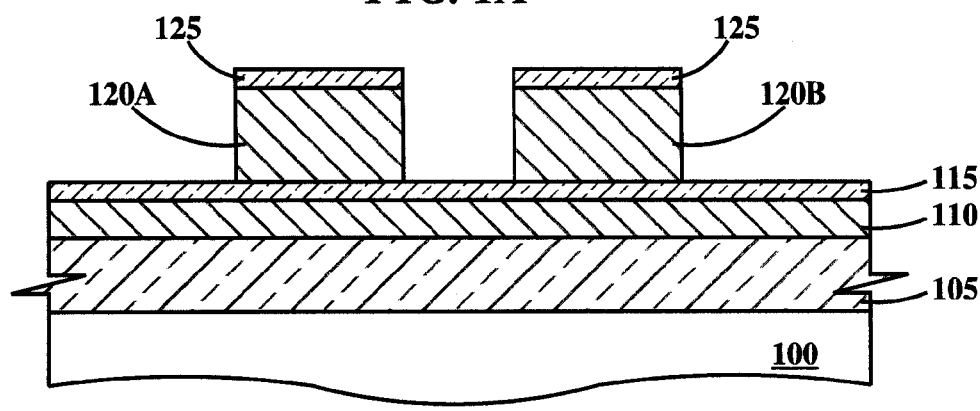

In FIG. 1B, a first electrically conductive wordline 120A and a second electrically conductive wordline 120B are formed on a top surface of first dielectric layer 115. First and second wordlines 120A and 120B are each covered by a respective dielectric cap 125 formed on respective top surfaces of the wordlines. First and second wordlines 120A and 120B and dielectric caps 125 may be formed, for example, by deposition of a conductive layer on the top surface of first dielectric layer 115, deposition of a capping layer on a top surface of the conductive layer followed by a photolithographic masking process and an anisotropic etch to define the first and second wordlines and dielectric caps.

A photolithographic masking process includes, applying a layer of photoresist, exposing the photoresist to actinic radiation through a patterned mask that will block the radiation from reaching regions of the photoresist layer, and developing the photoresist layer to generate a pattern of photoresist. After etching of underlying structure, the islands of photoresist are removed.

In one example, first and second wordlines 120A and 120B comprise doped polysilicon, W, Ti, Ta, Cu, TiN, TaN, Al and combinations thereof. In one example, dielectric caps 125 comprise $Si_3N_4$.

Figure 1C:
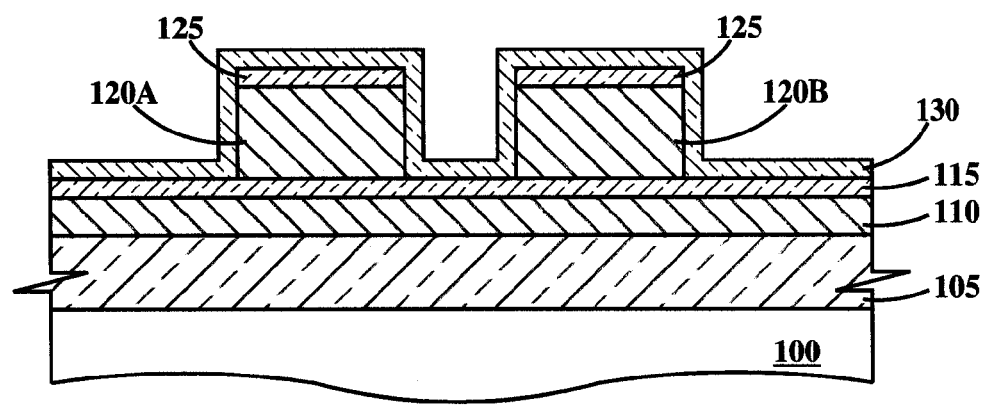

In FIG. 1C, a conformal second dielectric layer 130 is formed over all exposed surfaces of first dielectric layer 115, first and second wordlines 120A and 120B, and dielectric caps 125. In one example, second dielectric layer 130 comprises $Si_3N_4$. In one example, second dielectric layer 130 is a high K (dielectric constant) material, examples of which include but are not limited metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high K dielectric material has a relative permittivity above about 10. In one example, second dielectric layer 130 is about 7 nm to about 20 nm thick.

Figure 1D:
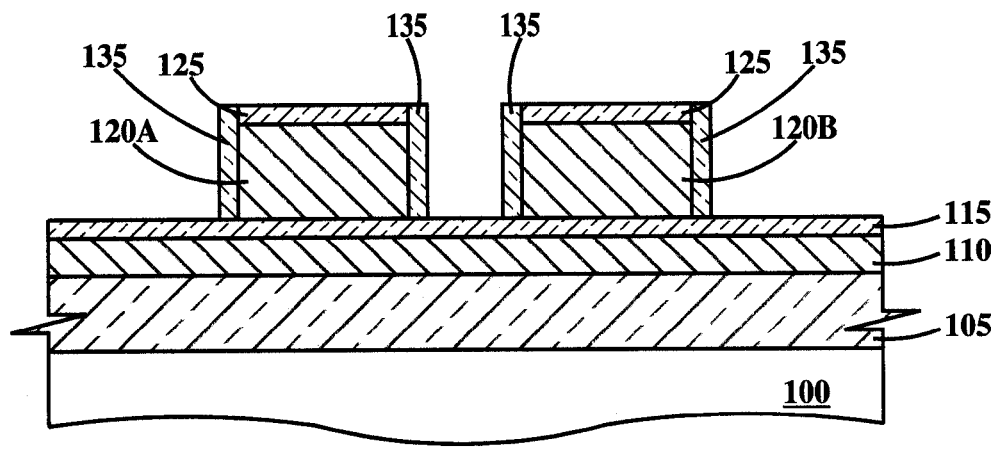

In FIG. 1D, a reactive ion etch (RIE) process is performed to form, from second dielectric layer 130 (see FIG. 1C), dielectric sidewall spacers 135 on sidewalls of first and second wordlines 120A and 120B.

Figure 1E:
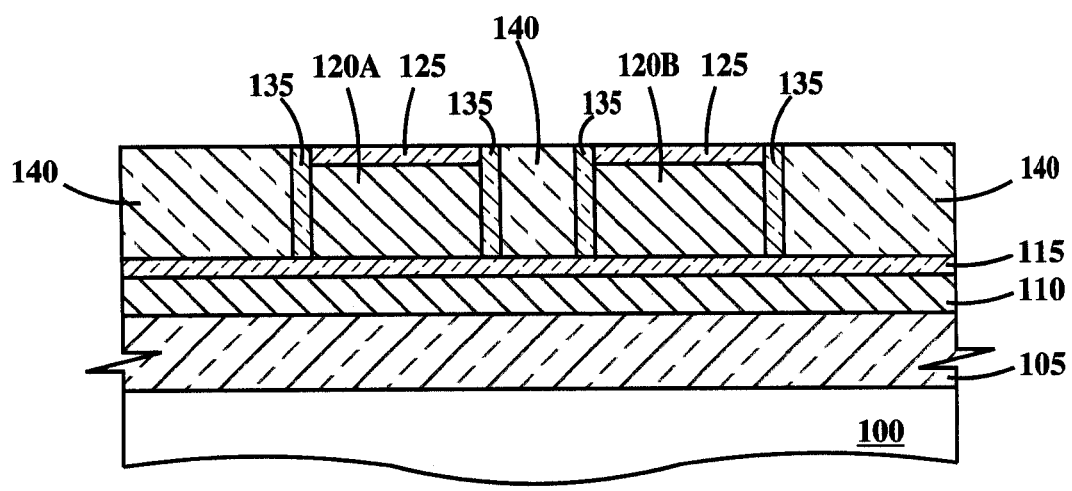

In FIG. 1E, a second insulating layer 140 is formed. Top surfaces of second insulating layer 140 are coplanar with top surfaces of dielectric cap 125. In one example, second insulating layer 140 may be formed by deposition of a dielectric material to a depth greater than the distance between the top surface of first dielectric layer 115 and top surfaces of dielectric caps 125, followed by a chemical-mechanical-polish (CMP). In one example second insulating layer 140 comprises $SiO_2$.

Figure 1F:
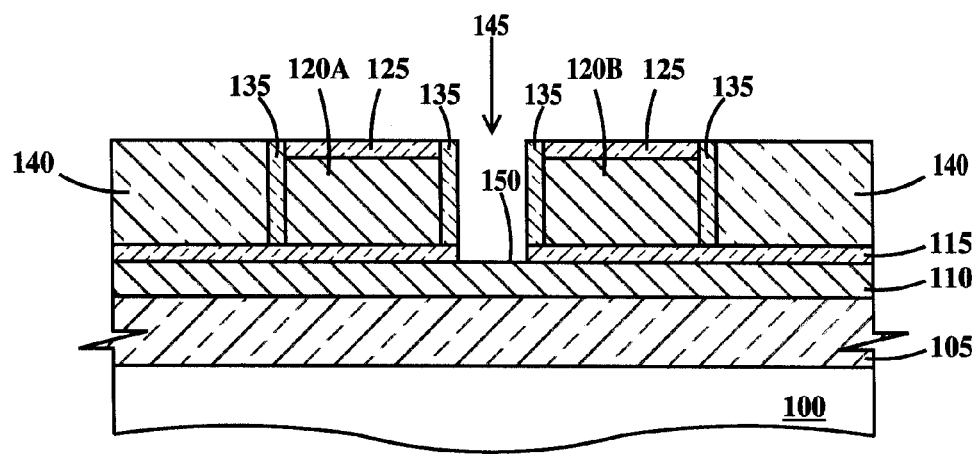

In FIG. 1F, a trench 145 is formed between first and second wordlines 120A and 120B exposing a top surface 150 of bitline 110 by removing second insulating layer 140 and first dielectric layer 115 from between the wordlines. In one example, trench 145 is formed using a photolithographic masking process followed by a RIE.

Figure 1G:
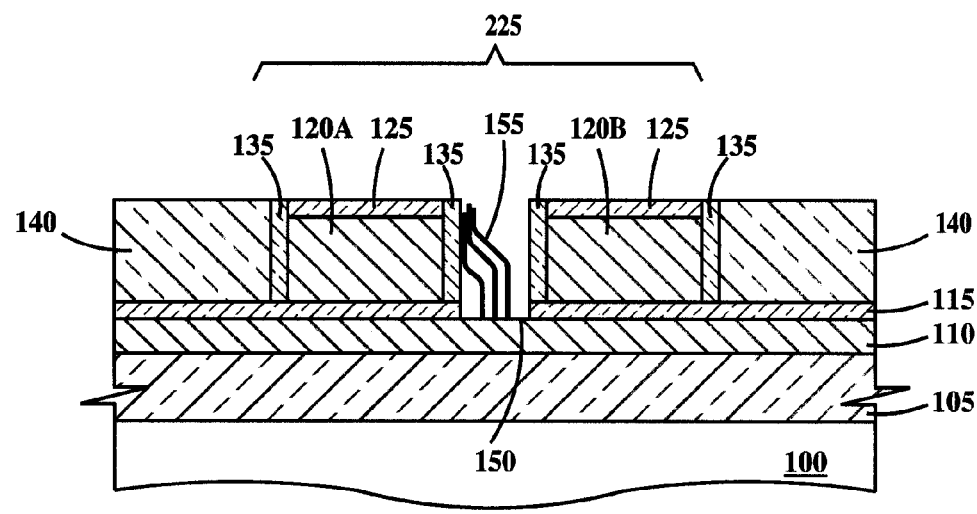

In FIG. 1G, one or more electrically semi-conductive or conductive CNTs 155 are grown on exposed top surface 150 of bitline 110 between first and second wordlines 120A and 120B. CNTs 155 have two opposite ends. The first ends are permanently attached to bitline 110 but the second ends are not permanently attached to any other structure. CNTs 155 extend upward from bitline 110 in the generally vertical direction. In one example, growth conditions for CNTs 155 are selected so as to grow at least one and up to a number of CNTs sufficient to cover exposed dielectric spacers 135 on one or the other of wordlines 120A or 120B with about a single layer of upper ends of CNTs 155. In one example, the growth of CNTs 155 is limited such that the CNTs do not extend above the top surfaces of dielectric caps 125. CNTs 155 are flexible so as to be able to bend and temporally touch sidewall spacer 135 on wordline 120A (shown) or touch sidewall spacer 135 on wordline 120B. It is expected that single-wall CNTs will be more flexible than multi-wall CNTs.

Bitline 110, wordlines 120A and 120B, dielectric caps 125, dielectric spacers 135 and CNTs 155 comprise a switching or memory device (or memory cell) 225 according to the first embodiment of the present invention. Substrate 100 may be a semiconductor substrate, for example a bulk silicon or silicon-on-insulator (SOI) substrate, and include devices such as transistors, capacitors, resistors, diodes and inductors which are wired together to form support circuits for device 225.

Figure 2:
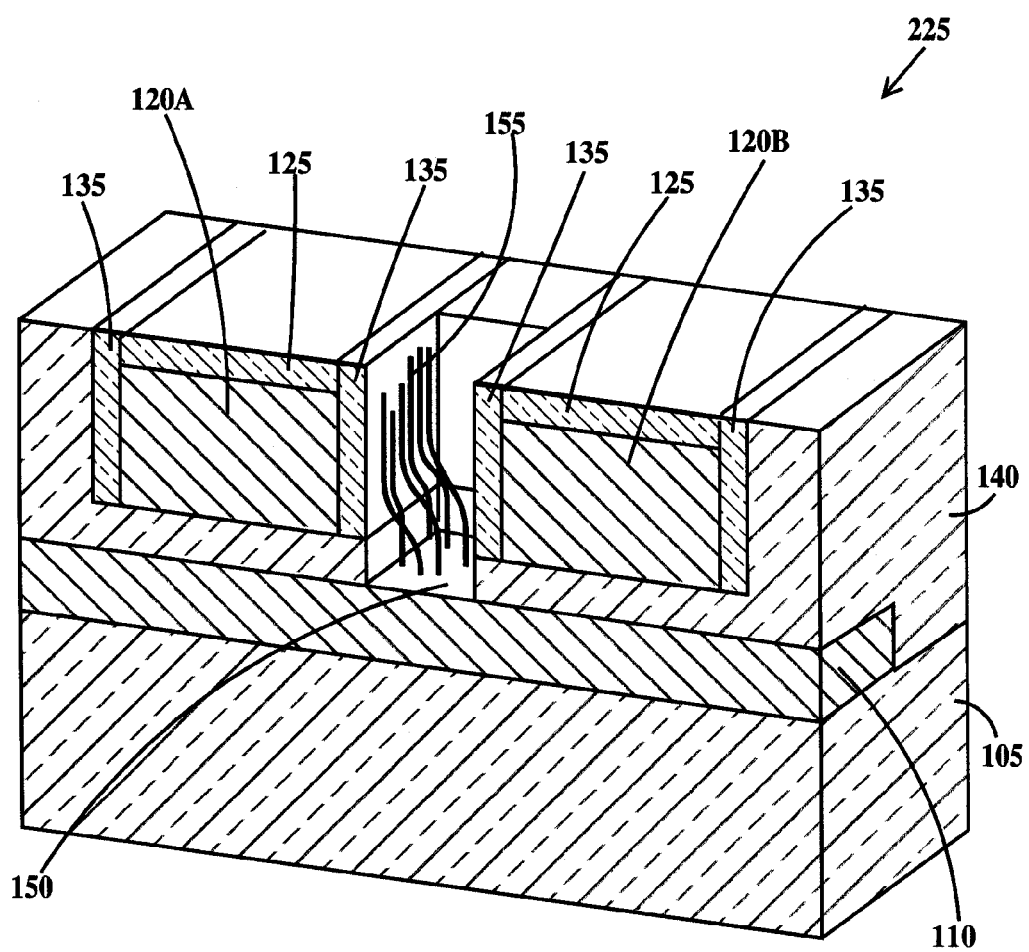
FIG. 2 is an isometric cross-section of a device according to the first embodiment of the present invention.

Operation of device 225 is described infra, in relationship to FIG. 2, but a discussion of van der Waals' forces is required first. Though not entirely understood, in general, van der Waals' forces are attractive forces between molecules. Bonding in a molecule is caused by orbiting electrons. Any given electrons may be thought of being on one side or the other of a molecule in any one instance of time creating a surplus of negative charge on one side of the molecule and a lack of charge (positive charge) on the opposite side of the molecule, i. e. a dipole. When the dipoles on adjacent molecules are aligned positive pole to negative pole, negative pole to positive pole, there is a weak and transient electrostatic attraction. Since an object is made up of many molecules, there are always a finite number of pairs molecules having attracting dipoles. Van der Waals' forces are very small forces and can be easily broken, but absent an external force to force two objects apart, objects attached to one another by van der Waals' forces will remain attached. At the nano-scale, van der Walls; forces are significant forces.

Because van der Waals' forces do not require externally supplied power, the devices of the embodiments of the present invention when de-powered will retain the state in which they remained when last powered, and are thus non-volatile memory devices. Because van der Waals' forces are not effected by ionizing radiation, the devices of the embodiments of the present invention will retain their state even when struck by ionizing radiation and are thus radiation-hard devices.

FIG. 2 is an isometric cross-section of a device according to the first embodiment of the present invention. In FIG. 2, with a positive (negative) charge on first wordline 120A and a negative (positive) charge on second wordline 120B and bitline 110, CNTS 155 will become negatively (positively) charged and be attracted toward first wordline 120A. With sufficient voltage applied between first wordline 120A and bitline 110, the upper ends of CNTs 155 will press against dielectric sidewall spacer 135 on first wordline 120A. With the voltage differential removed (first and second wordlines 120A and 120B and bitline all at the same potential), CNTS 155 will continue to stick to sidewall spacer 135 on first wordline 120A because of van der Wall attraction between molecules in CNTs 155 and molecules in dielectric sidewall spacer 135.

The location of CNTs 155 can be "flipped" by placing a positive (negative) charge on second wordline 120B and a negative (positive) charge on first wordline 120A and bitline 110, CNTS 155 will become negatively (positively) charged and be attracted toward second wordline 120B. With sufficient voltage, applied between second wordline 120B and bitline 110, the upper ends of CNTs 155 will release from sidewall spacer 135 of first wordline 120A and move to and press against sidewall spacer 135 on second wordline 120B. With the voltage differential removed (first and second wordlines 120A and 120B and bitline all at the same potential), CNTS 155 will continue to stick to dielectric sidewall spacer 135 on second wordline 120B because of van der Wall attraction between molecules in CNTs 155 and molecules in dielectric sidewall spacer 135.

The state (whether CNTs are attached to dielectric sidewall spacer 135 of first wordline 120A or attached to dielectric sidewall spacer 135 of second wordline 120B) can be sensed as a change in capacitance in the wordlines or a spike in current flow through the bitline.

Figure 3A:
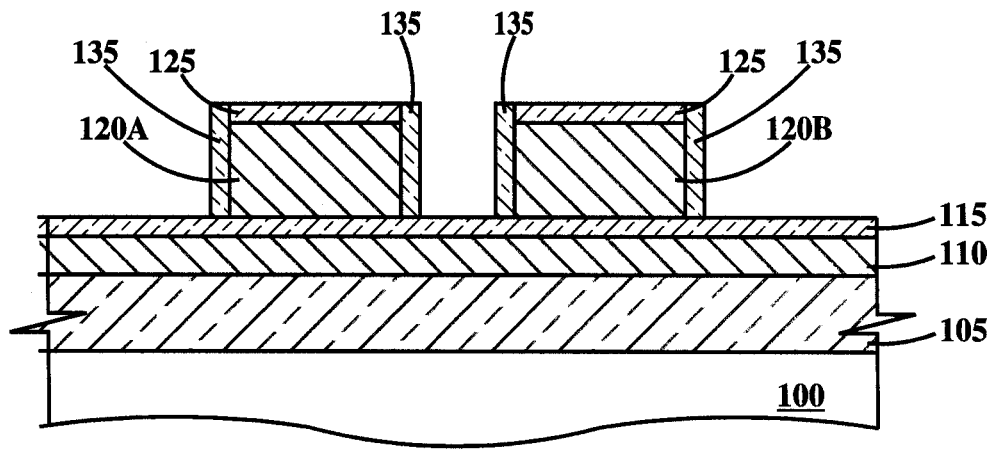
FIGS. 3A through 3G are cross-sectional views illustrating fabrication of a device according to a second embodiment of the present invention.

FIGS. 3A through 3G are cross-sectional views illustrating fabrication of a device according to a second embodiment of the present invention. The initial fabrication steps for the second embodiment of the present invention are that same as illustrated in FIGS. 1A, 1B, 1C and 1D and described supra. FIG. 3A is the same as FIG. 1D.

Figure 3B:
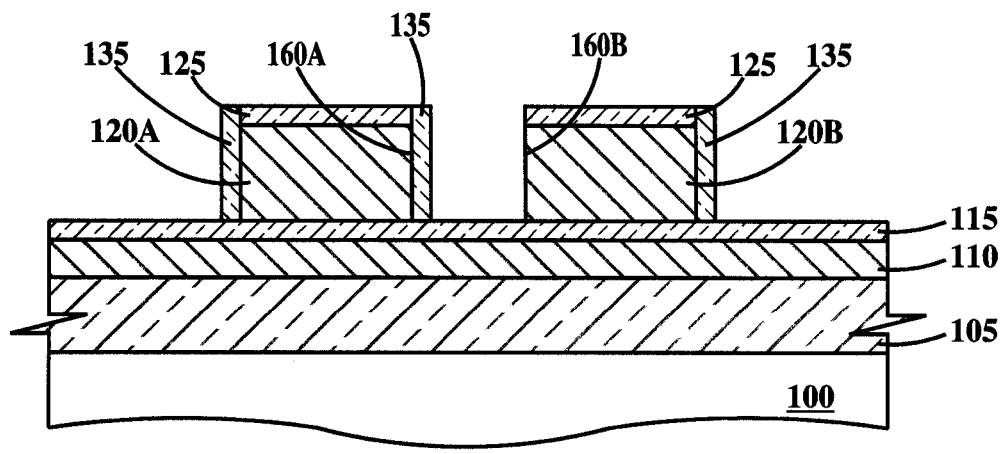

In FIG. 3B, a photolithographic masking process followed by an isotropic etch is performed to remove dielectric sidewall spacer 135 from a sidewall 160B of second wordline 120B that is adjacent to first wordline 120A, exposing sidewall 160B of the first wordline 120B. Sidewall 160A of first wordline 120A is still covered by sidewall spacer 135.

Figure 3C:
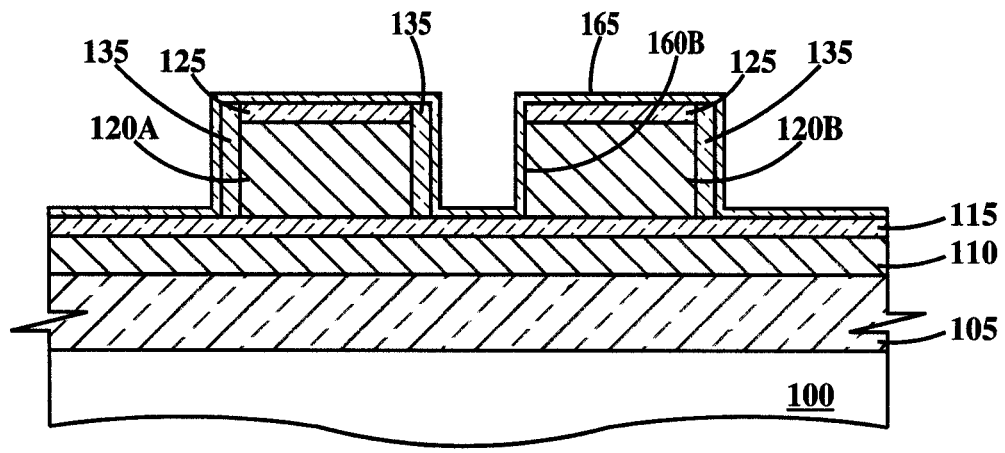

In FIG. 3C, a conformal third dielectric layer 165 is formed over all exposed surfaces of first dielectric layer 115, dielectric caps 125, dielectric sidewall spacers 135, and exposed sidewall 160B of second wordline 120B. In one example, third dielectric layer 165 comprises $Si_3N_4$. In one example third dielectric layer 165 is a high K (dielectric constant) material, examples of which include but are not limited to metal oxides such as $Ta_2O_5$, $BaTiO_3$, $HfO_2$, $ZrO_2$, Al$_2$O$_3$, or metal silicates such as HfSi$_x$O$_y$ or HfSi$_x$O$_y$N$_z$ or combinations of layers thereof. A high K dielectric material has a relative permittivity above about 10. In one example, third dielectric layer 165 is about 1 nm to about 5 nm thick.

Figure 3D:
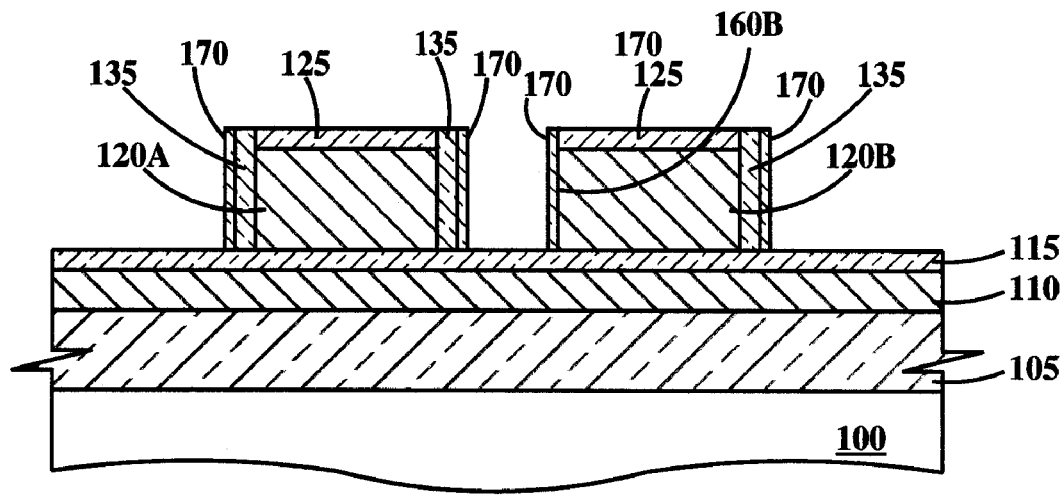

In FIG. 3D, a RIE process is performed to form, from third dielectric layer 165 (see FIG. 3C), dielectric sidewall spacers 170 on dielectric sidewall spacers 135 of first wordline 120A, dielectric sidewall spacer 135 of second wordline 120B, and sidewall 160B of second wordline 120B.

Figure 3E:
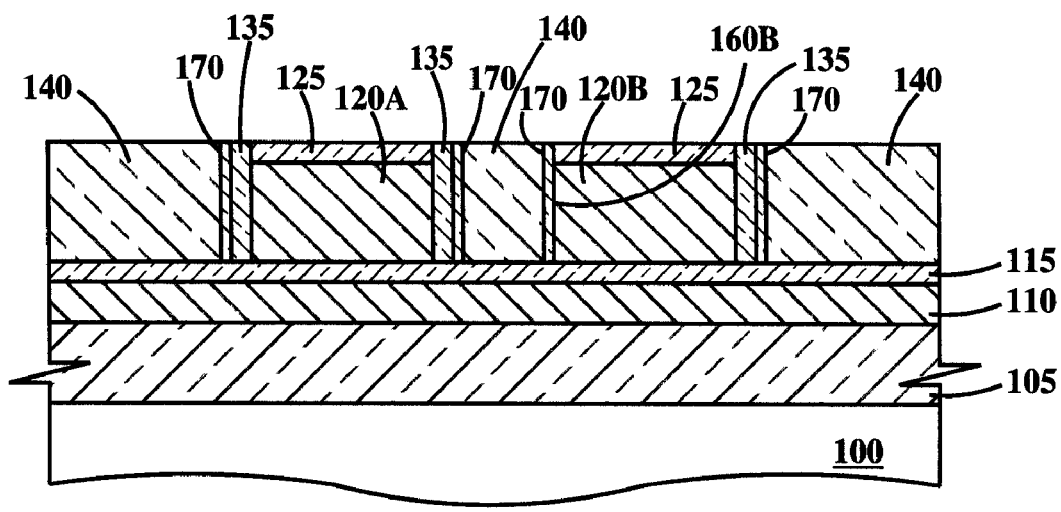
Figure 3F:
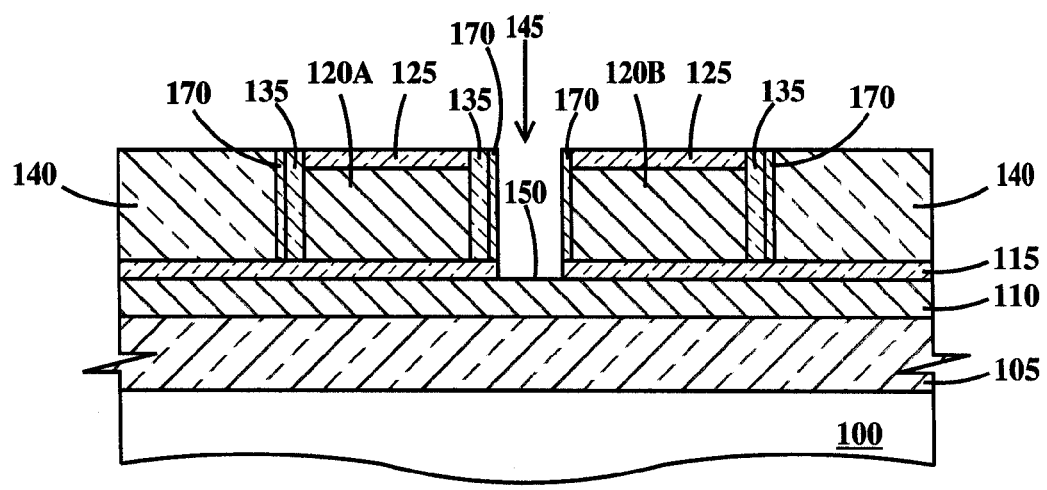
Figure 3G:
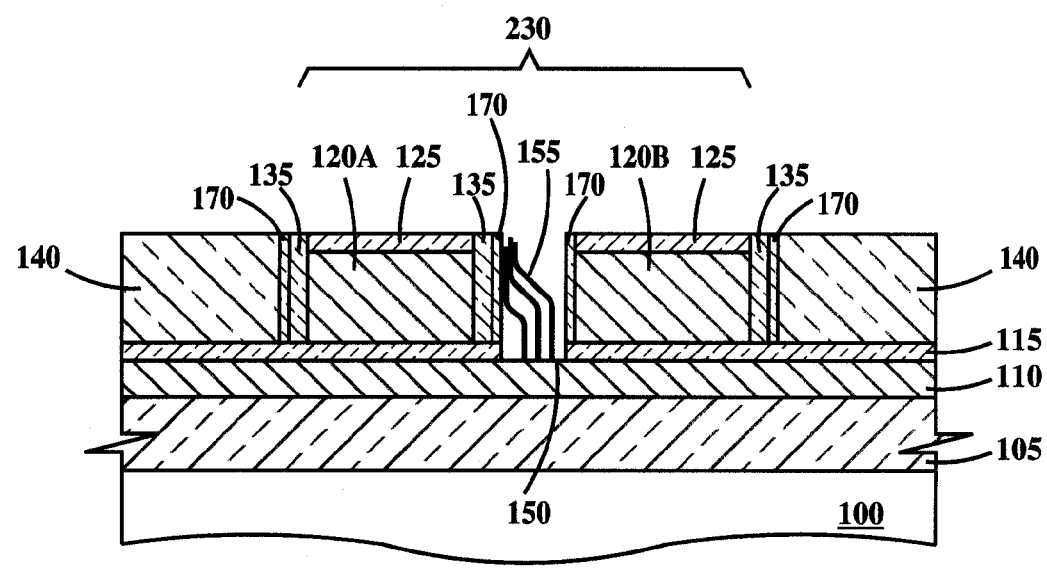

In FIG. 3E, second insulating layer 140 is formed as described supra in reference to FIG. 1E. In FIG. 3F, trench 145 is formed between first and second wordlines 120A and 120B exposing a top surface 150 of bitline 110 as described supra in reference to FIG. 1F. In FIG. 3G, one or more electrically conductive CNTs 155 are grown on exposed top surface 150 of bitline 110 between first and second wordlines 120A and 120B as described supra in reference to FIG. 1G.

Bitline 110, wordlines 120A and 120B, dielectric caps 125, dielectric sidewall spacers 135, dielectric spacers 170, and CNTs 155 comprise a switching or memory device (or memory cell) 230 according to the second embodiment of the present invention. Substrate 100 may be a semiconductor substrate, for example a bulk silicon or silicon-on-insulator (SOI) substrate, and include devices such as transistors, capacitors, resistors, diodes, and inductors which are wired together to form support circuits for device 230. Operation of device 230 is described infra, in relationship to FIG. 4.

Figure 4:
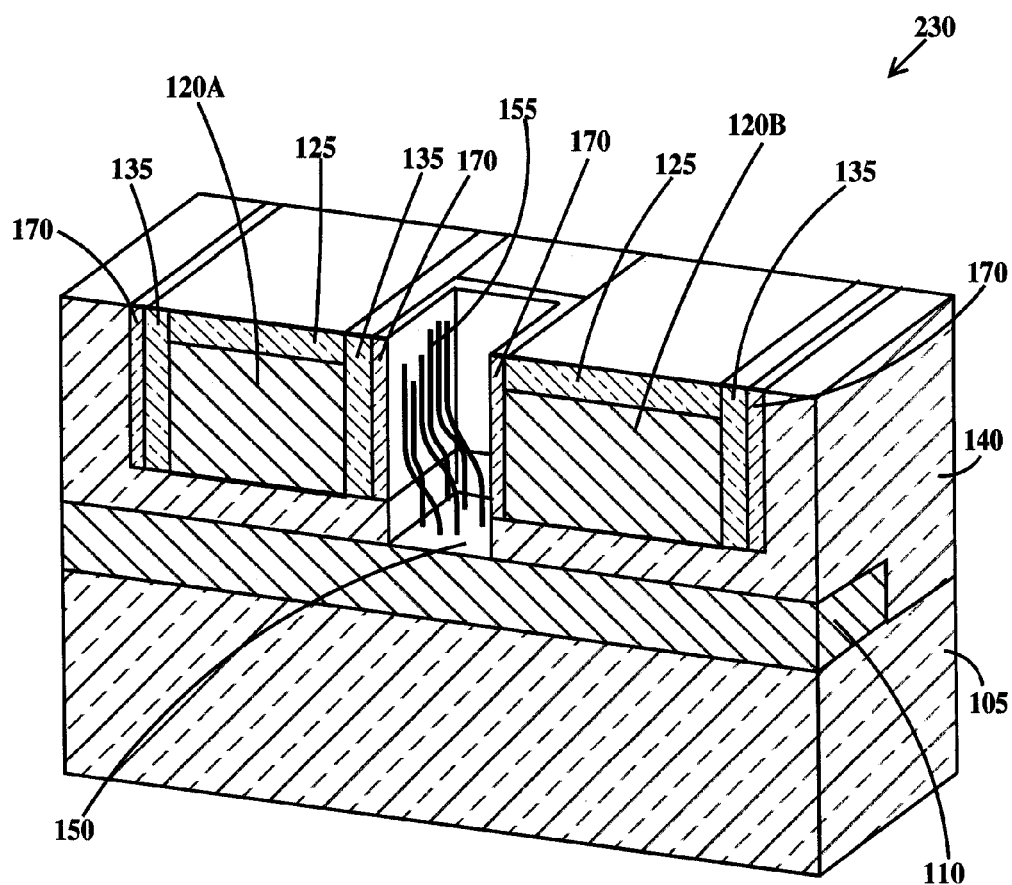
FIG. 4 is an isometric cross-section of a device according to the second embodiment of the present invention.

FIG. 4 is an isometric cross-section of a device according to the second embodiment of the present invention. Change of state of device 230 is similar to that described for device 225 in reference to FIG. 2. However, the method of sensing the state of device 230 is different from that described for device 225 (see FIG. 2). The state (whether CNTs 155 are attached to dielectric spacer 170 on dielectric sidewall spacer 135 of first wordline 120A or attached to dielectric spacer 170 of second wordline 120B) can be sensed as a flow of tunneling leakage current (a flow of electrons through the dielectric) from second wordline 120B, through dielectric spacer 170, through CNTs 155 to bitline 110 when CNTs 155 are attached to dielectric spacer 170 of second wordline 120B by van der Waals' forces. There is no current flow (or a much smaller current flow) from first wordline 120A to bitline 110 when CNTs 155 are attached to dielectric spacer 170 on dielectric sidewall spacer 135 of first wordline 120A.

Tunneling leakage current is a flow of current through dielectric spacer 170 is similar to tunneling current flow in a field effect transistor (FET). Tunneling current flow in a FET is current flow from the gate, through the gate dielectric into the channel and thence to either the source or the drain. Tunneling leakage current is different from normal current flow from the source to the drain (or vice versa) in a FET when the gate of the FET is at the threshold voltage (V$_T$) of the device. Tunneling leakage current is different from sub-threshold leakage current flow from the source to the drain (or vice versa) in a FET when the gate of the FET is below threshold voltage (VT) of the device Therefore, a dielectric spacer 170 should to be thin enough to allow tunneling leakage current while the thickness of a dielectric sidewall spacer 135 or the combined thickness of a dielectric spacer 170 and a dielectric sidewall spacer 135 should be thick enough to preclude tunneling leakage current or at least prevent it rising above a predetermined current level.

Figure 5A:
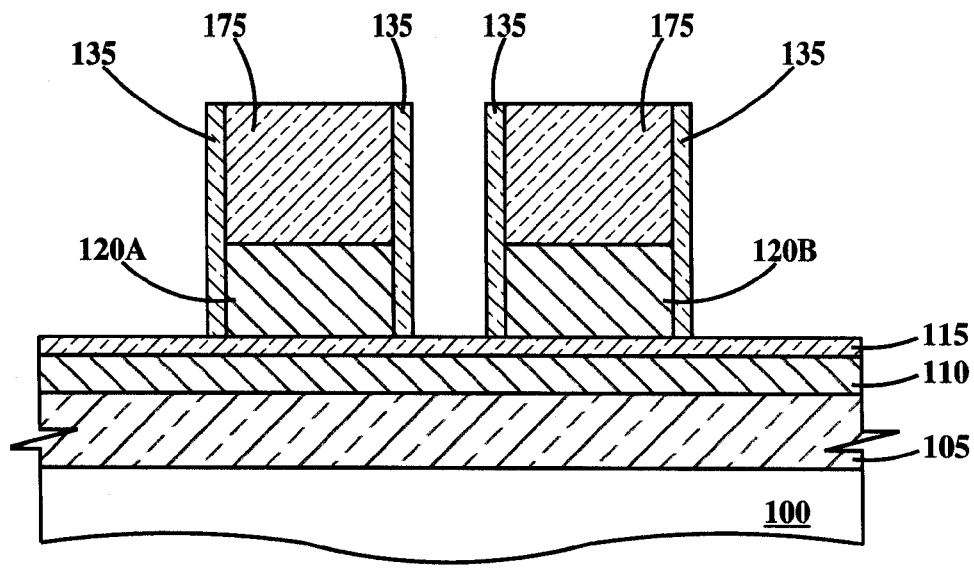
FIGS. 5A through 5K are cross-sectional views illustrating fabrication of a device according to a third embodiment of the present invention.

FIGS. 5A through 5K are cross-sectional views illustrating fabrication of a device according to a third embodiment of the present invention. The initial fabrication steps for the third embodiment of the present invention are that same as illustrated in FIGS. 1A, 1B, 1C and 1D and described supra, with the exception that dielectric cap 125 of FIGS. 1B, 1C and 1D is replaced with a significantly thicker dielectric cap 175 in FIG. 5A. Otherwise FIG. 5A is similar to FIG. 1D. In one example, dielectric cap 175 comprises Si$_3$N$_4$ and is about 0.85 to about 1.5 times as thick as wordlines 120A and 120B as measured in a direction perpendicular to the top surface of substrate 100.

Figure 5B:
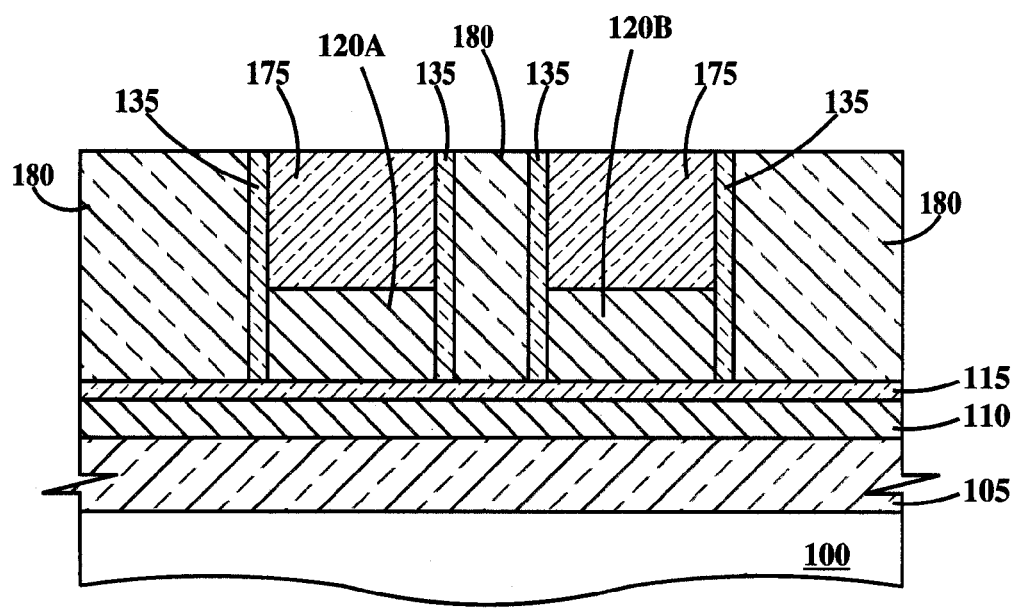

In FIG. 5B, a second insulating layer 180 is formed. A top surface of a second insulating layer 180 is coplanar with top surfaces of dielectric cap 175. In one example, second insulating layer 180 may be formed by deposition of a dielectric material to a depth greater than the distance between the top surface of first dielectric layer 115 and top surfaces of dielectric caps 175, followed by a CMP. In one example second insulating layer 180 comprises SiO$_2$.

Figure 5C:
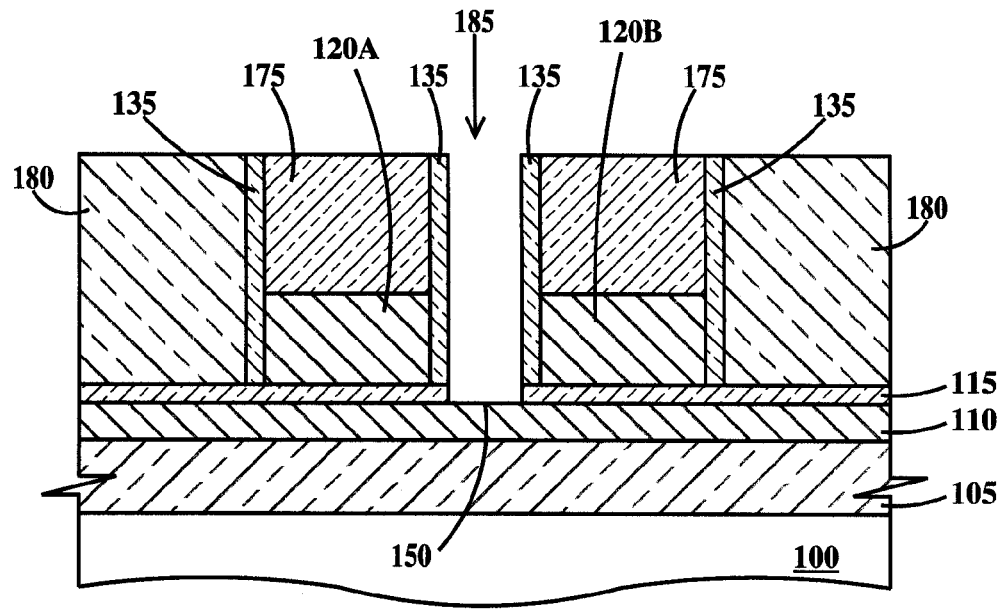

In FIG. 5C, a trench 185 is formed between first and second wordlines 120A and 120B exposing top surface 150 of bitline 110 by removing second insulating layer 180 and first dielectric layer 115 from between the wordlines. In one example, trench 185 is formed using a photolithographic masking process followed by a RIE.

Figure 5D:
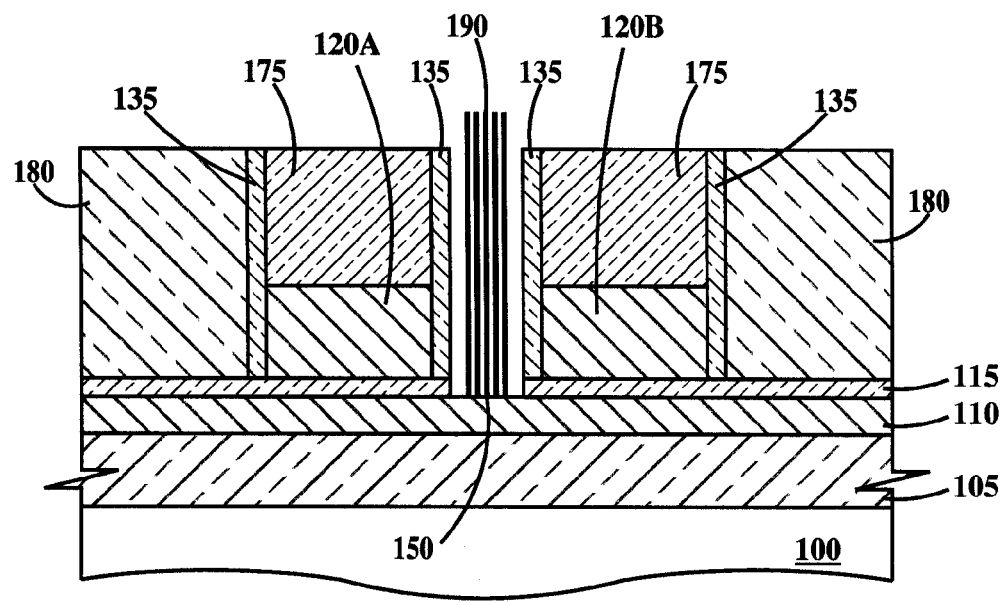

In FIG. 5D, one or more electrically conductive or semi-conductive CNTs 190 are grown on exposed top surface 150 of bitline 110 between first and second wordlines 120A and 120B. CNTs 190 have two ends. The first ends are permanently attached to bitline 110 but the second ends are not permanently attached to any other structure. In one example growth conditions for CNTs 190 are selected so as to grow at least one and up to a number of CNTs sufficient to cover exposed dielectric sidewall spacers 135 on one or the other of wordlines 120A or 120B with about a single layer of upper ends of CNTs 190. CNTs 190 may extend (as shown) above the top surfaces of dielectric caps 175 or may be shorter and not extend above the top surfaces of dielectric caps 175.

Figure 5E:
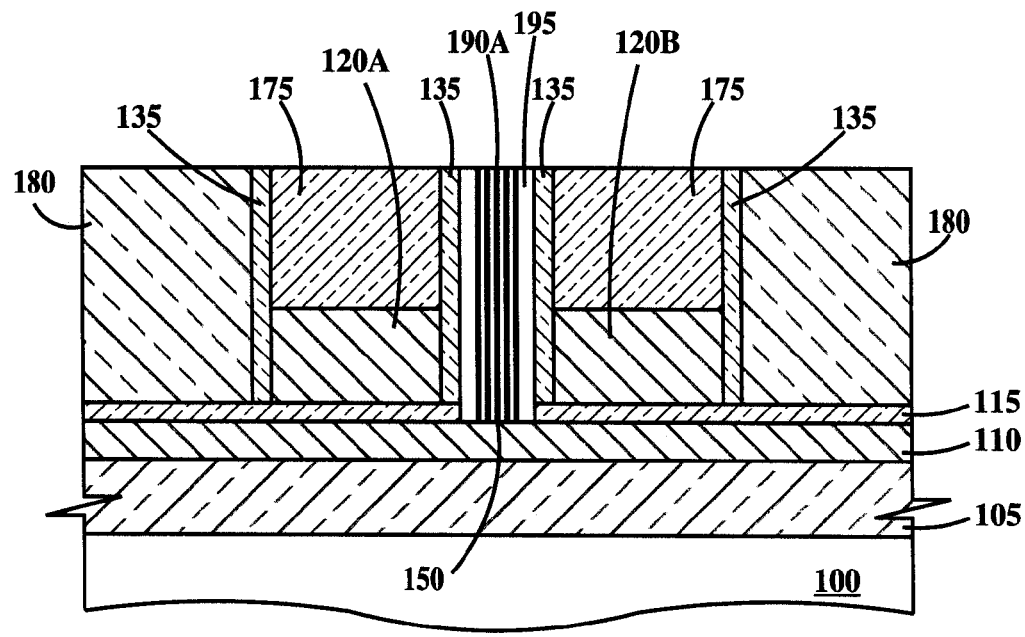

In FIG. 5E, the space (trench 185 of FIG. 5C) between wordlines 120A and 120B is filled with fill material 195 and a CMP performed to so a top surface of fill material 195 is coplanar with top surfaces of dielectric caps 175. This CMP also polishes away any portions of CNTs 190 that extended above top surface of dielectric caps 175, forming CNTs 190A. In one example fill material 195 comprises polycrystalline or amorphous germanium (Ge).

Figure 5F:
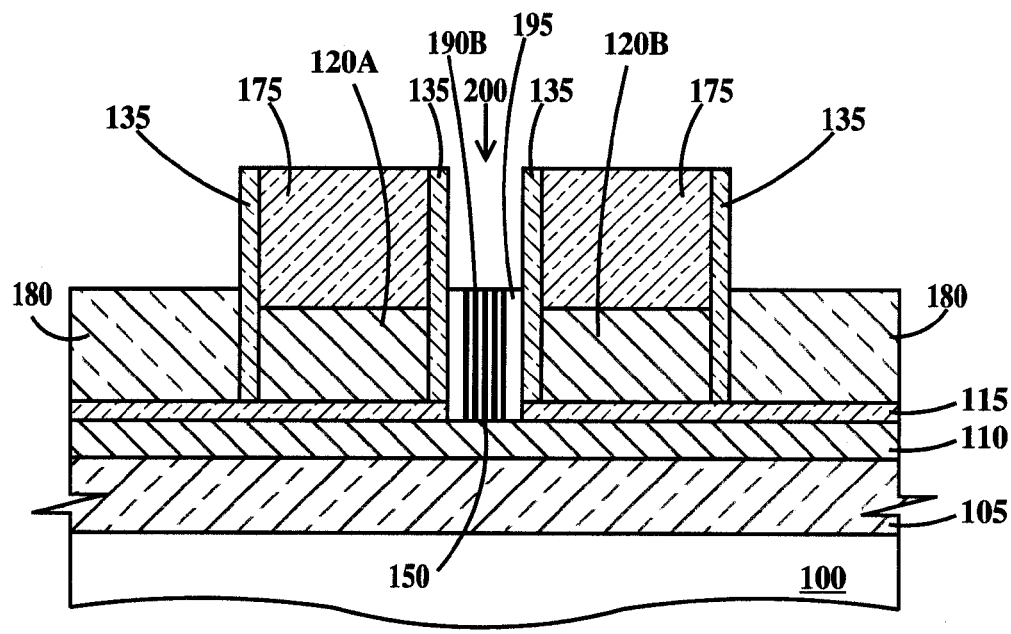

In FIG. 5F, upper portions of fill layer 195 are removed to form a trench 200 partially filled with fill material 195. Upper portions of second insulating layer 180 can also be removed. Next, CNTs 190A of FIG. 5E are also reduced in height, to the same height as the remaining portion of fill layer 195, to form CNTS 190B. These three operations may be performed as one, two or three distinct etch operations. In the case of two operations, the CNTs 190 may be etched along with the fill material 195, the CNTs 190 may be etched along with the second insulating layer 180, or the fill material 195 may be etched along with the second insulating layer 180.

Figure 5G:
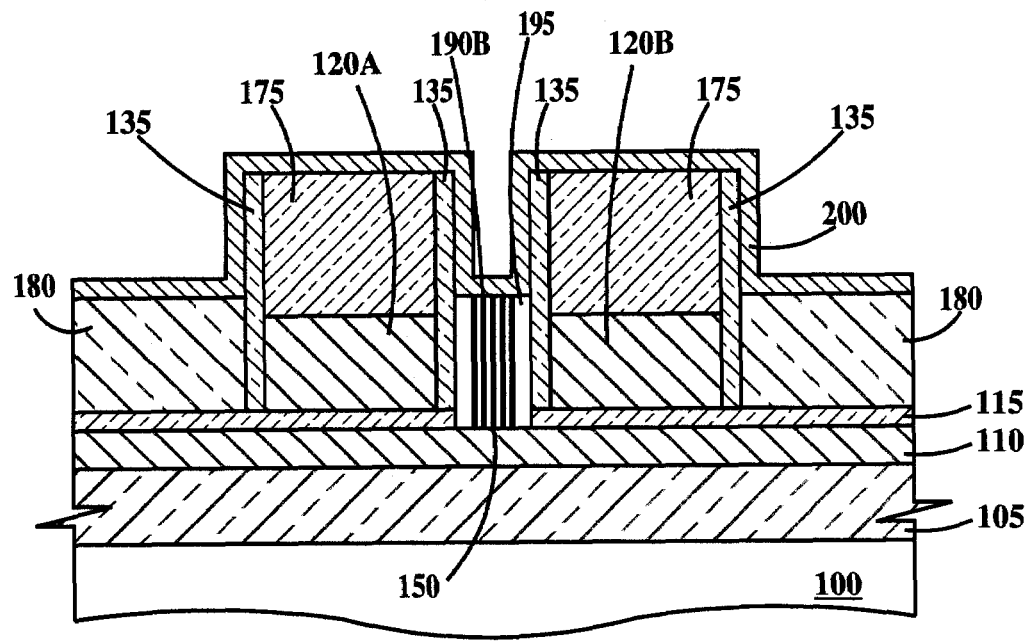

In FIG. 5G, a conformal conductive layer 200 is formed over all exposed surfaces of second insulating layer 180, fill material 195, dielectric sidewall spacers 135, and dielectric caps 175. In one example, conductive layer 200 comprises WSi$_x$, TiSi$_2$, TiN, TaN, doped polysilicon, or combinations thereof.

Figure 5H:
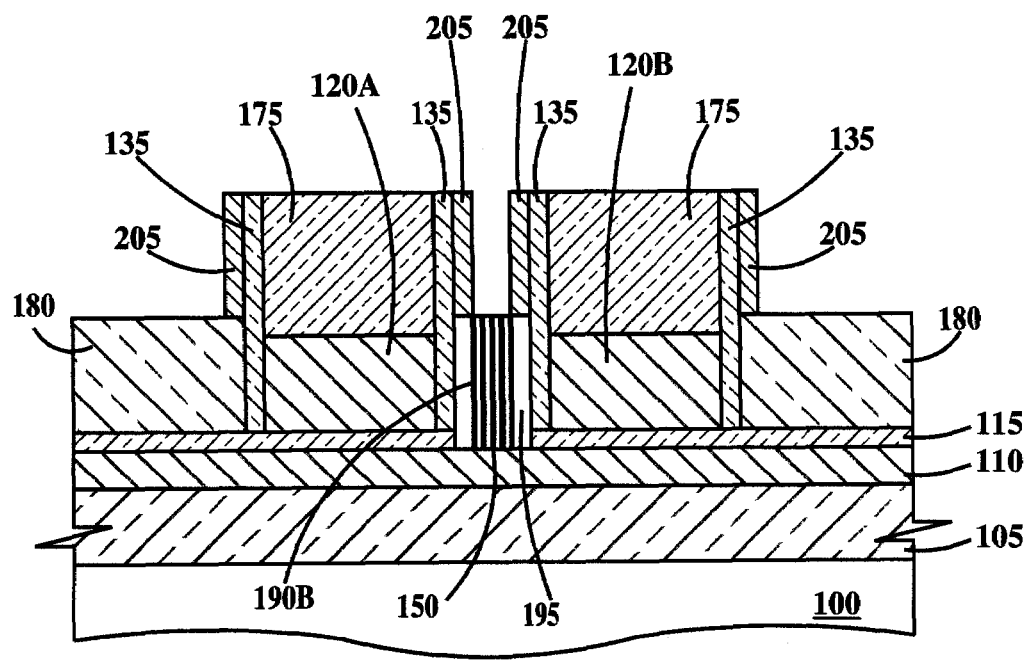

In FIG. 5H, an RIE is performed to form conductive spacers 205 on exposed sidewall surfaces of dielectric sidewall spacers 135.

Figure 5I:
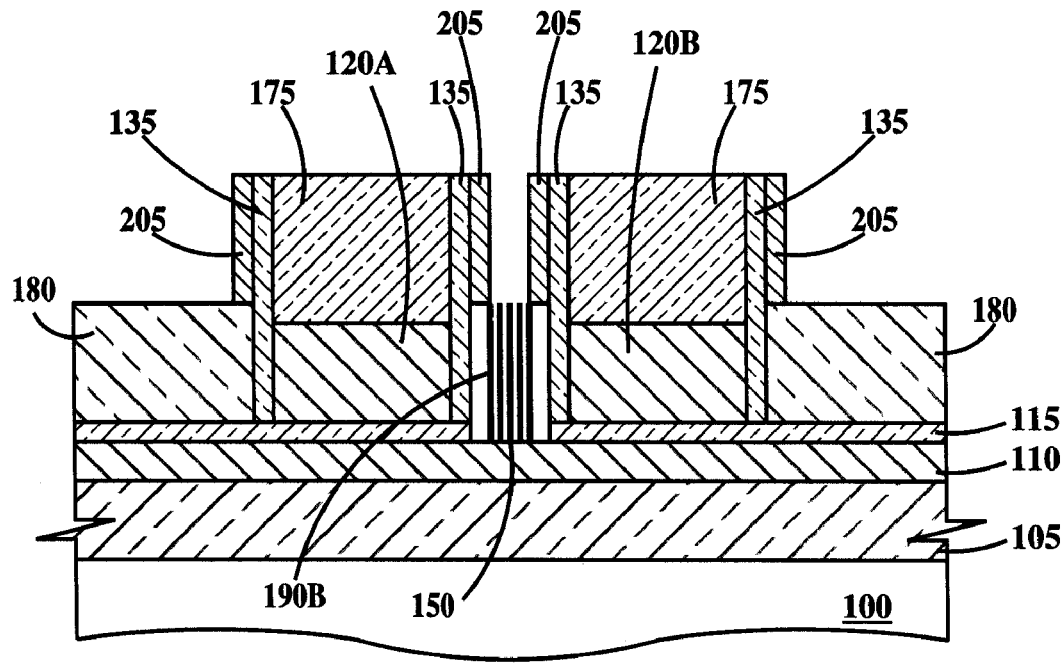

In FIG. 5I, fill material 195 (see FIG. 5F) is removed. In the example of fill material 195 being Ge, an etch in aqueous hydrogen peroxide ($H_2O_2$) or other oxidizing solution may be used to remove the fill material 195. CNTs 190B are now free-standing.

Figure 5J:
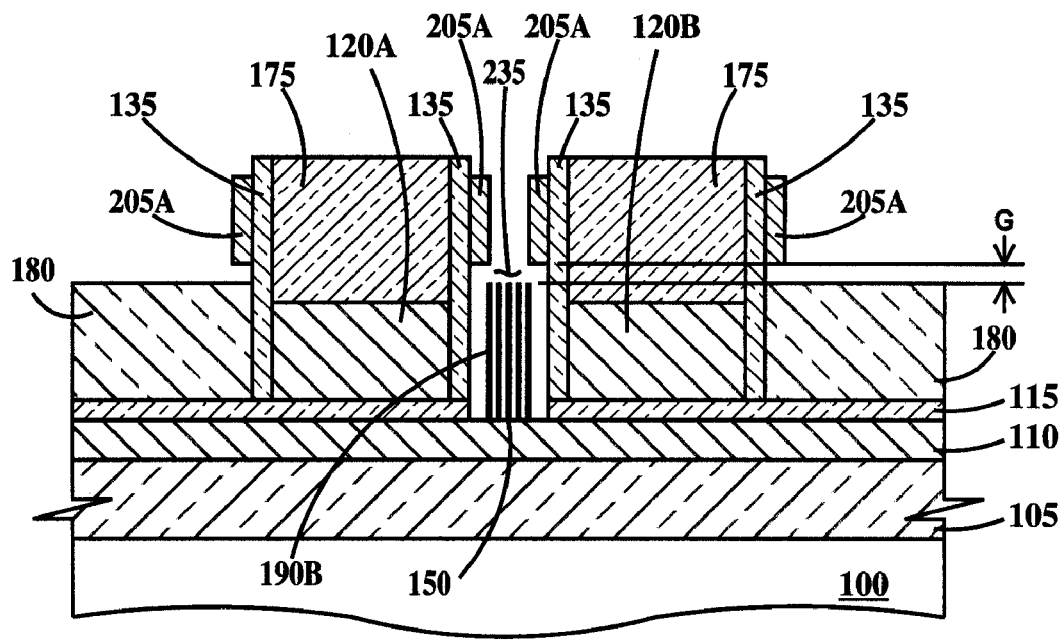

In FIG. 5J, an isotropic etch (for example a wet etch or a high pressure plasma etch) is performed to remove a small amount of material from conductive spacers 205 (see FIG. 5I) generating conductive spacers 205A and a field emission gap 235 having of dimension G between bottom edges of conductive spacers 205A and top ends of CNTS 190B. In one example, G is between about 4 nm and about 10 nm.

Figure 5K:
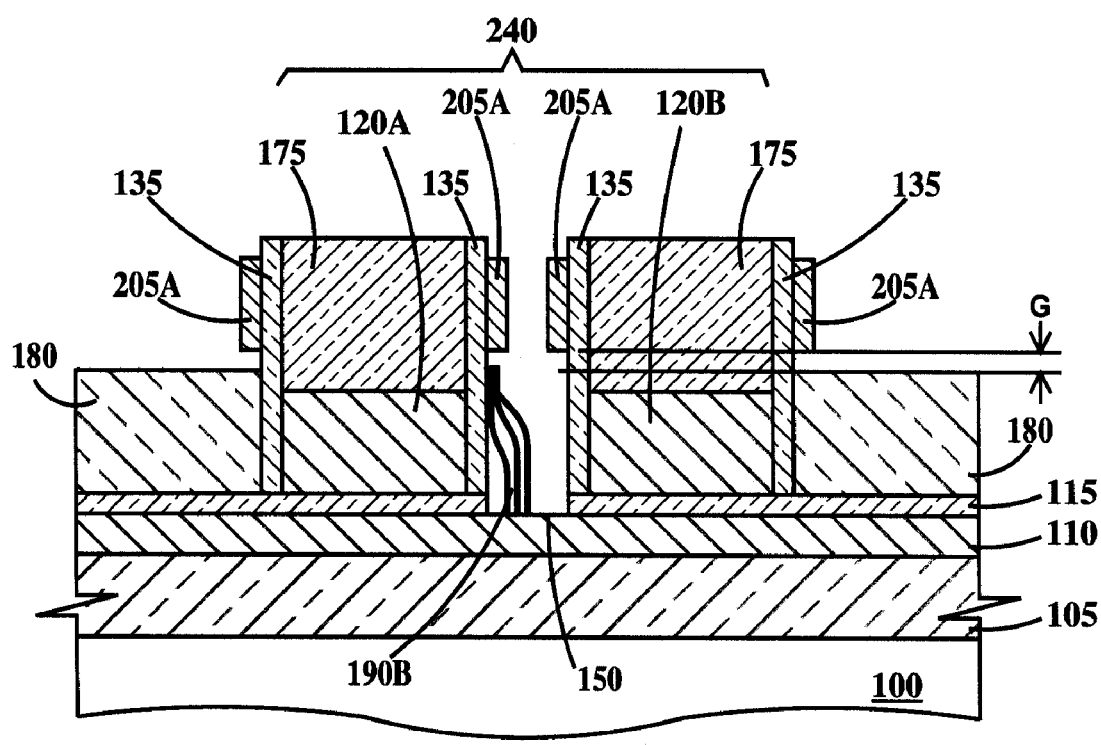

In FIG. 5K, CNTs 155 are flexible so as to be able to bend and temporally touch dielectric sidewall spacer 135 on first wordline 120A (shown) or touch dielectric sidewall spacer 135 on second wordline 120B. Bitline 110, wordlines 120A and 120B, dielectric sidewall spacers 135, dielectric caps 175, conductive spacers 205A, and CNTs 190B comprise a switching or memory device (or memory cell) 240 according to the third embodiment of the present invention. Substrate 100 may be a semiconductor substrate, for example a bulk silicon or silicon-on-insulator (SOI) substrate, and include devices such as transistors, capacitors, resistors, diodes and inductors which are wired together to form support circuits for device 240. Operation of device 240 is described infra, in relationship to FIG. 6.

Figure 6:
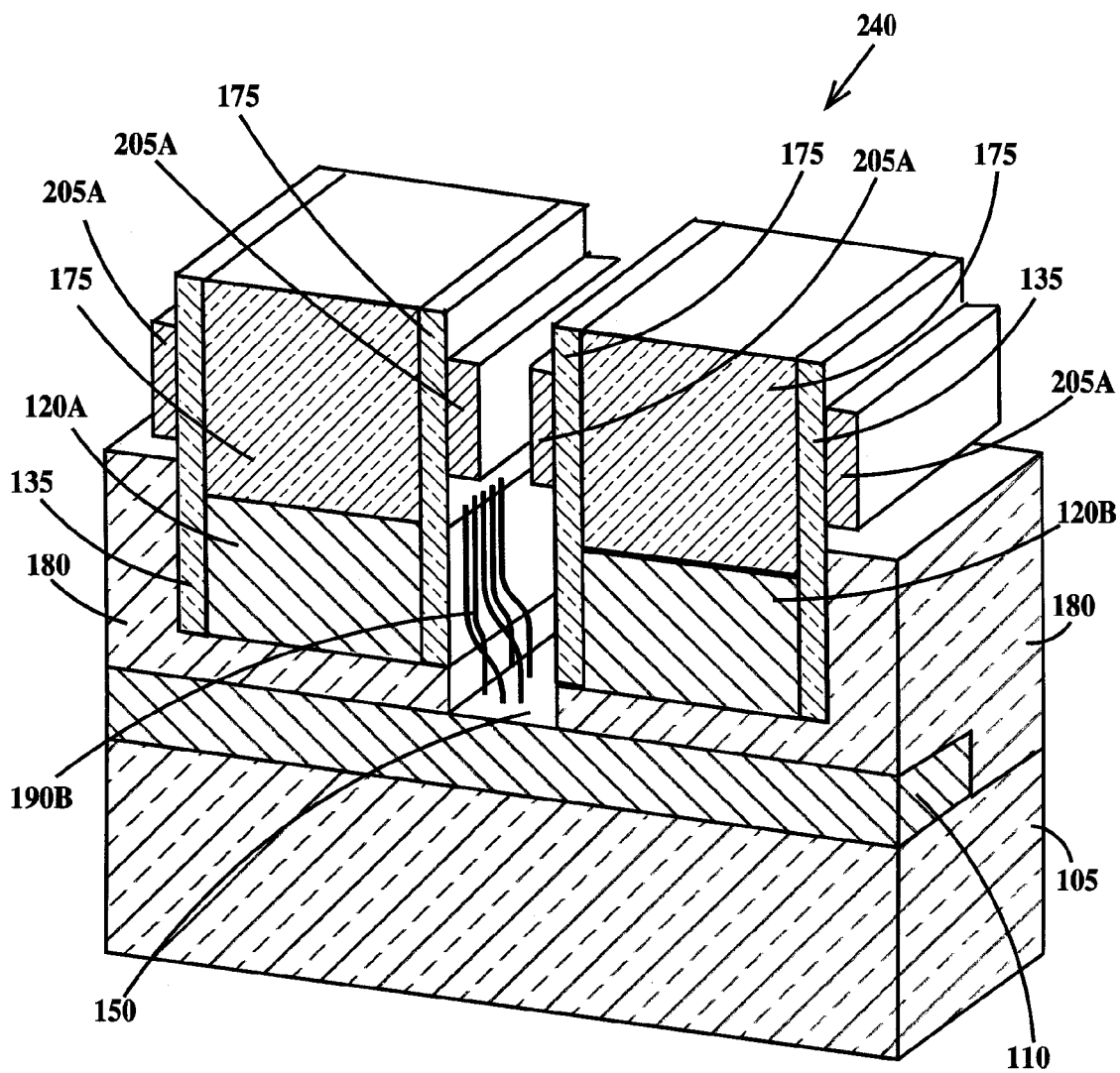
FIG. 6 is an isometric cross-section of a device according to the third embodiment of the present invention.

FIG. 6 is an isometric cross-section of a device according to the third embodiment of the present invention. Change of state of device 240 is similar to that described supra for device 225 in reference to FIG. 2. However, the method of sensing the state of device 230 is different from that described for device 225 (see FIG. 2). The state (whether CNTs 190B are attached to dielectric sidewall spacer 135 of first wordline 120A or attached to dielectric sidewall spacer 135 of second wordline 120B by van der Waals' forces) can be sensed as a flow of field emission current from bitline 110 to conductive spacer 205A of first wordline 120A to conductive spacer 205A of second wordline 120B. To enhance the amount of field emission current, polarities may be adjusted so that conductive spacers 205A are anodes and CNTs 190B cathodes. Therefore it is useful to keep bitline 110 negative and opposite polarities on wordlines 120A and 120B, the conductive spacers associated with the positive wordline being the anode through which current will flow.

Figure 7:
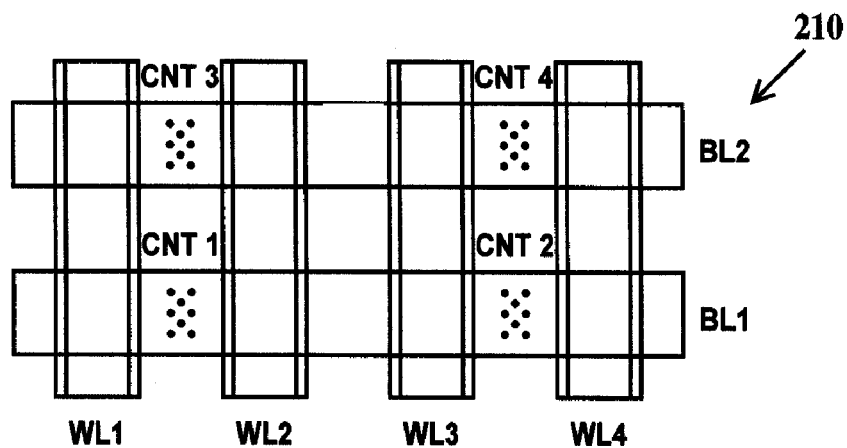
FIGS. 7, 8 and 9, are plan views illustrating memory arrays using devices according the embodiments of the present invention.
Figure 8:
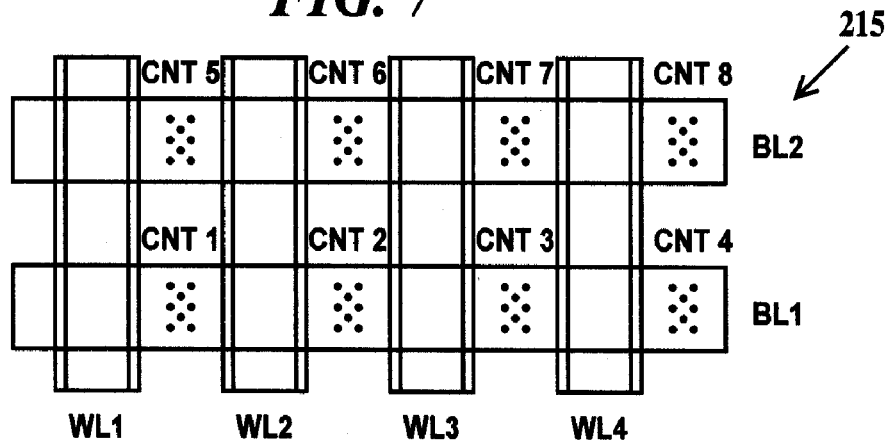
Figure 9:
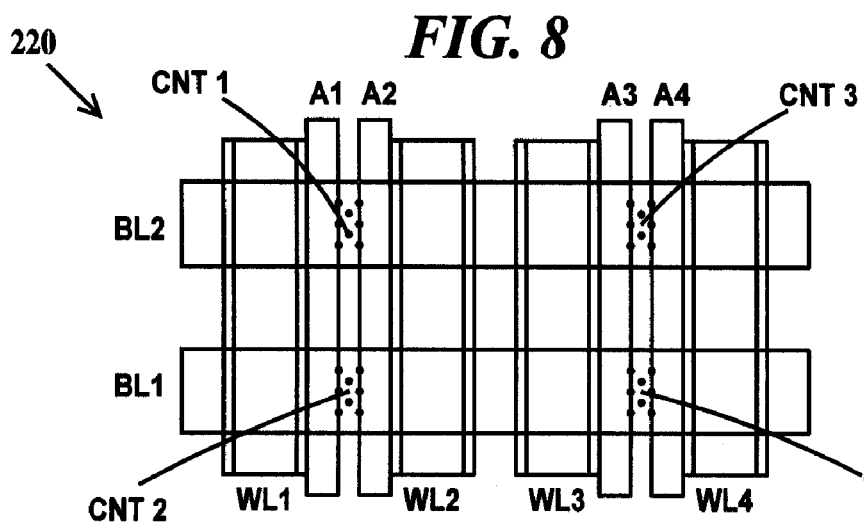

FIGS. 7, 8 and 9, are plan views illustrating memory arrays using devices according the embodiments of the present invention. FIG. 7 illustrates a first array of memory cells 210 using devices according to the first and second embodiments of the present invention. In FIG. 7, a first cell comprises wordlines WL1 and WL2, CNTs CNT1 and bitline BL1. A second cell comprises wordlines WL3 and WL4, CNTs CNT2 and bitline BL1. A third cell comprises wordlines WL1 and WL2, CNTs CNT3 and bitline BL2. A fourth cell comprises wordlines WL3 and WL4, CNTs CNT4 and bitline BL2. To write the first cell of array 210, wordline WL1 is brought up while wordlines WL2, WL3, and WL 4 are brought down. The state of BL1 will then determine whether CNTs CNT1 are attracted to, and attach via van der Waals' forces to, WL1 or WL2. All cells between wordlines WL1 and WL2 must be written simultaneously. While writing the first cell of array 210 WL3 and WL4 are shorted together so that the second cell is not disturbed.

FIG. 8 illustrates a second array of memory cells 215 using devices according to the first and second embodiments of the present invention. In FIG. 8, a first cell comprises wordlines WL1 and WL2, CNTs CNT1 and bitline BL1. A second cell comprises wordlines WL2 and WL3, CNTs CNT2 and bitline BL1. A third cell comprises wordlines WL3 and WL4, CNTs CNT3 and bitline BL1. A fourth cell comprises wordlines WL4 and WL5 (not shown), CNTs CNT4 and bitline BL1. A fifth cell comprises wordlines WL1 and WL2, CNTs CNT5 and bitline BL2. A sixth cell comprises wordlines WL2 and WL3, CNTs CNT6 and bitline BL2. A seventh cell comprises wordlines WL3 and WL4, CNTs CNT7 and bitline BL2. An eighth cell comprises wordlines WL4 and WL5 (not shown), CNTs CNT8 and bitline BL2.

To write the second cell of array 215, wordline WL1 and WL2 are brought up while wordlines WL3, WL4 and WL 5 are brought down. In the array of FIG. 8, in order not to disturb inactive wordline bits, all wordlines to the "left" of the active cell (i. e. wordline WL1) are "shorted" to the active wordline, wordline WL2, and all wordlines to the "right" of the active cell (i. e. wordlines WL3 and WL4) are shorted together and to wordline WL2. (They are held at the opposite polarity to the "left-hand" wordlines).

FIG. 9 is similar to FIG. 7, except a third array of memory cells 220 comprises devices according to the third embodiment of the present invention. In FIG. 9, a first cell comprises wordlines WL1 and WL2, CNTs CNT1, bitline BL1, and anodes (conductive spacers) A1 and A2. A second cell comprises wordlines WL1 and WL2, CNTs CNT2 bitline BL2, and anodes A1 and A2. A third cell comprises wordlines WL3 and WL4, CNTs CNT3, bitline BL1, and anodes A3 and A4. A fourth cell comprises wordlines WL3 and WL4, CNTs CNT4, bitline BL2, and anodes A3 and A4. To write the first cell of array 220, wordline WL1 is brought up, wordlines WL2, WL3 and WL 4 are brought down, and the bitline potential is set appropriately, depending on which "side" of the first cell CNTs CNT1 are to attach. To read the first cell, bitline BL1 is biased negatively, and other bitlines and anodes A1 and A2 are biased positively. A tunnel current will become established only between CNTs CNT1 and only the anode on the side of the first cell to which the CNTs CNT1 are attached.

Devices according to the third embodiment of the present invention may be arranged into arrays similar to those depicted in FIGS. 7 and 8. The number of cells illustrated in FIGS. 7, 8 and 9 are to be taken as exemplary and any number of cells arranged in any number of rows and columns may be fabricated.

Thus, the embodiments of the present invention provide memory and switching devices that are both non-volatile and radiation hard.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure comprising:

an insulating layer on a top surface of a substrate;

an electrically conductive bitline formed in said insulating layer or on a top surface of said insulating layer, a top surface of said bitline parallel to said top surface of said substrate;

a first electrically conductive wordline having a bottom surface, a top surface, a first sidewall and an opposite second sidewall;

a second electrically conductive wordline having a bottom surface, a top surface, a first sidewall and an opposite second sidewall, said top and bottom surfaces of said first and second wordlines parallel to said top surface of said bitline, said first and second sidewalls about perpendicular to said top surface of said bitline said first and second wordlines spaced apart, said first sidewall of said first wordline facing said first sidewall of said second wordline, said second sidewall of said first wordline facing away from said second sidewall of said second wordline;

a dielectric layer between said bottom surfaces of said first and second wordlines and said top surface of said bitline;

a dielectric first spacer on said first sidewall of said first wordline and a dielectric second spacer on said first sidewall of said second wordline, said first and second spacers separated by a gap, said first spacer abutting said gap and intervening between said first sidewall of said first wordline and said gap, said second spacer abutting said gap and intervening between said first sidewall of said second wordline and said gap, said top surface of said bitline exposed between said first and second spacers;

at least one electrically conductive nanotube having a first end and an opposite second end, said first end permanently attached to said top surface of said bitline, said at least one nanotube extending away from said top surface of bitline in said gap between said dielectric first and second spacers;

a first dielectric cap having a bottom surface, a top surface and a third sidewall, said bottom surface of said first dielectric cap in direct physical contact and coextensive with said top surface of said first wordline;

a second dielectric cap having a bottom surface, a top surface and a fourth sidewall, said bottom surface of said second dielectric cap in direct physical contact and coextensive with said top surface of said second wordline, said third and fourth sidewalls facing each other, said first spacer extending over and in direct physical contact with said third sidewall and said second spacer extending over and in direct physical contact with said fourth sidewall;

an electrically conductive third spacer on said first spacer and an electrically conductive fourth spacer on said second spacer, said third and fourth spacers spaced apart, said third and fourth spacers facing each other, a bottom surface of said third spacer facing and overhanging said top surface of said bitline exposed between said first and second spacers, and a bottom surface of said fourth spacer facing and overhanging said top surface of said bitline exposed between said first and second spacers;

when an upper portion of said at least one nanotube proximate to said second end of said at least one nanotube is in contact with said first spacer, said second end of said at least one nanotube is positioned under but not touching a bottom surface of third spacer; and when said upper portion of said at least one nanotube proximate to said second end of said at least one nanotube is in contact with said second spacer, said second end of said at least one nanotube is positioned under but not touching said bottom surface of fourth spacer.

2. The structure of claim 1, wherein said at least one nanotube is flexible and has a length between said first and second ends such that a portion of said one or more nanotubes proximate to said second end may reversibly contact said first or said second spacer.

3. The structure of claim 1, wherein said at least one nanotube is reversibly held in contact with said first or second spacers by van der Waals' forces.

4. The structure of claim 1, wherein said at least one nanotube is a carbon nanotube.

5. The structure of claim 1, wherein said at least one nanotube is a single-wall carbon nanotube.

6. The structure of claim 1, further including:
means for voltage biasing said first wordline and said third spacer opposite to said second wordline and said bitline; and
means for voltage biasing said second wordline and said fourth spacer opposite to said first wordline.

7. The structure of claim 1, further including:
means for sensing a field emission current across a first gap between said second end of said at least one nanotube and said bottom surface of said third spacer; and
means for sensing a field emission current across a second gap between said second end of said at least one nanotube and said bottom surface of said fourth spacer.

8. The structure of claim 1 wherein said bitline comprises a catalytic material for the formation of carbon nanotubes.

* * * * *